(12) United States Patent
Mikawa et al.

(10) Patent No.: US 6,602,721 B2
(45) Date of Patent: Aug. 5, 2003

(54) METHOD FOR FABRICATING FERROELECTRIC MEMORY DEVICE AND METHOD FOR FABRICATING THE SAME

(75) Inventors: Takumi Mikawa, Kyoto (JP); Toshie Kutsunai, Kusatsu (JP); Yuji Judai, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/987,002

(22) Filed: Nov. 13, 2001

(65) Prior Publication Data

US 2002/0115226 A1 Aug. 22, 2002

(30) Foreign Application Priority Data

Feb. 20, 2001 (JP) ........................................ 2001-043806

(51) Int. Cl.[7] ................................................. H01G 7/06
(52) U.S. Cl. ........................................... 438/3; 438/240
(58) Field of Search ............................ 438/3, 238–240, 438/253–256, 381, 396–399

(56) References Cited

U.S. PATENT DOCUMENTS

| 5,335,138 A | * | 8/1994 | Sandhu et al. ............... 257/306 |
| 6,171,910 B1 | * | 1/2001 | Hobbs et al. ................ 438/195 |
| 6,339,008 B1 | * | 1/2002 | Takenaka .................... 438/239 |

FOREIGN PATENT DOCUMENTS

JP 2000-138349 5/2000

* cited by examiner

*Primary Examiner*—Jey Tsai
(74) *Attorney, Agent, or Firm*—Nixon Peabody LLP; Donald R. Studebaker

(57) ABSTRACT

The ferroelectric memory device has a plurality of capacitor elements each formed on a semiconductor substrate and composed of a lower electrode, a capacitor insulating film made of a ferroelectric material formed on the lower electrode, and an upper electrode formed on the capacitor insulating film. Each of the lower electrodes is buried in a burying insulating film to have an upper surface planarized relative to the upper surface of the burying insulating film and has a plane configuration such that the distance from an arbitrary position on the upper surface of the lower electrode to the nearest end portion thereof is 0.6 μm or less.

8 Claims, 11 Drawing Sheets

METHOD FOR FABRICATING FERROELECTRIC MEMORY DEVICE AND METHOD FOR FABRICATING THE SAME

BACKGROUND OF THE INVENTION

The present invention relates to a ferroelectric memory device having a capacitor element using a ferroelectric material for a capacitor insulating film and to a method for fabricating the same.

An early-stage ferroelectric memory device that was first mass-produced had a small capacity of about 1 Kbits to 64 Kbits and a planar structure in which the lower electrode is larger in size than the upper electrode. In recent years, however, a device having a large capacity of about 256 Kbits to 4 Mbits and a stacked structure in which the lower electrode is smaller than or equal to the upper electrode has been the main target for development. It has been expected to greatly increase the degree of integration and reliability of a nonvolatile memory device by implementing a ferroelectric memory device having the stacked structure.

An example of a conventional ferroelectric memory device having a stacked structure is disclosed in, e.g., Japanese Patent Laid-Open Publication No. 2000-138349.

As shown in FIG. 11A, a capacitor element portion in the conventional ferroelectric memory device is formed above a semiconductor substrate 101 having an impurity diffusion layer 101a formed in an upper portion thereof and having an upper surface covered with an interlayer insulating film 102. A plurality of contact plugs 103 electrically connected to the impurity diffusion layer 101a are formed in the interlayer insulating film 102. A plurality of lower electrodes 104 electrically connected to the contact plugs 103 are buried in a burying insulating film 105 over the interlayer insulating film 102. The lower electrodes 104 are covered with a capacitor-insulating-film forming film 106 composed of a ferroelectric material and with an upper-electrode forming film 107, which are patterned subsequently to be opposed to the lower electrodes 104.

A fabrication method according to the conventional embodiment is characterized in that, to form the capacitor-insulating-film forming film 106 without being affected by the rough configuration of the respective upper surfaces of the interlayer insulating film 102 as an underlying layer and of the lower electrodes 104, the lower electrodes 104 are buried in the burying insulating film 105 by chemical mechanical polishing (CMP) such that the respective upper surfaces of the lower electrodes 104 and the burying insulating film 105 are planarized. This prevents the occurrence of variations in the thickness of the capacitor-insulating-film forming film 106 when it is formed by spin coating if there is a level difference between the upper surfaces of the lower electrodes 104 and the burying insulating film 105 and thereby provides a ferroelectric memory device with high reliability.

However, the conventional ferroelectric memory device has various problems, which will be described below.

The first problem is that, when the burying insulating film 105 deposited to cover the plurality of lower electrodes 104 is polished by CMP, part of the lower electrodes 104 or of a region to be formed with memory cells is left unpolished to form polishing residue since it is difficult to uniformly expose the lower electrodes 104 over the entire surface of the memory cell formation region.

To solve the first problem, over-polishing is performed to further polish the burying insulating film 105. As a result of over-polishing, however, the peripheral portions of the upper surfaces of the lower electrodes 104, which are not the target for polishing, are physically graded off under the pressure exerted during the polishing due to an erosion phenomenon resulting from the different compositions of the adjacent members, i.e., the burying insulating film 105 and the lower electrodes 104. When the peripheral portions of the lower electrodes 104 that have been once planarized are polished together with the burying insulating film 105 in which the lower electrodes 104 are buried, the upper surface of each of the lower electrodes 104 is inclined so that a so-called recess having a level difference d between the center portion and peripheral portion of the upper surface of the lower electrode is formed. This causes the second problem of the rough upper surfaces of the plurality of lower electrodes 104.

If over-polishing is performed with respect to the lower electrodes 104 with roughness observed at the upper surfaces thereof, the third problem arises that the lower electrodes 104 peel off from the burying insulating film 105.

In general, a plurality of memory cells are arranged in rows and columns on a semiconductor substrate. However, since the production yield tends to lower in the peripheral portion of the semiconductor substrate during the fabrication process, dummy electrodes 104a are provided on the outer circumferential portion of the semiconductor substrate. As shown in FIG. 11B, CMP is also used in the fabrication step for the contact plugs 103 in the step preceding the formation of the lower electrodes 104. When the CMP process is performed with respect to the contact plugs 103 and the interlayer insulating film 102, an erosion phenomenon as described above occurs during over-polishing since the members of the contact plugs 103 and the interlayer insulating film 102 have different compositions, so that the thickness of the interlayer insulating film 102 is smaller in a memory-cell main-body region A to be formed with the contact plugs 103. Specifically, the respective heights of the lower electrodes 104 and the dummy electrodes 104a from the semiconductor substrate differ depending on the presence or absence of the contact plugs 103. This leads to the fourth problem that part of the lower electrodes 104 peels off or remains unpolished to form polishing residue when the lower electrodes 104 and the dummy electrodes 104a are planarized. Such peeling off of the lower electrodes 104 from the film or polishing residue causes a bit defect in the ferroelectric memory device. Since the ferroelectric memory devices is a nonvolatile memory device which retains data for a specified period of time and from which the data is read as required, capacitor elements should be formed uniformly for all bits.

As stated previously, variations in the thickness of the interlayer insulating film 102 due to the recess of the lower electrode 104 and the erosion phenomenon of the contact plugs 103 inevitably induce variations in the thickness of the capacitor insulating film 106. As a result, the data retaining abilities of the individual memory cells are no more equal and the reliability of the memory device is thereby reduced.

SUMMARY OF THE INVENTION

It is therefore an object of the present invention to provide lower electrodes each having a specified configuration during the formation of capacitor elements each having a capacitor insulating film composed of a ferroelectric material, particularly during the formation of the lower electrodes by CMP, by solving the afore-mentioned conventional problems.

To attain the foregoing object, a ferroelectric memory device according to the present invention is so constructed as to positively utilize the erosion phenomenon which occurs during a CMP process performed in the step of forming the contact plugs or the lower electrodes.

Specifically, a first ferroelectric memory device according to the present invention comprises: a plurality of capacitor elements each formed on a semiconductor substrate and composed of a lower electrode, a capacitor insulating film made of a ferroelectric material formed on the lower electrode, and an upper electrode formed on the capacitor insulating film, each of the lower electrodes being buried in a burying insulating film to have an upper surface planarized relative to an upper surface of the burying insulating film and having a plane configuration such that a distance from an arbitrary position on the upper surface of the lower electrode to a nearest end portion thereof is about 0.6 μm or less.

In the first ferroelectric memory device, each of the lower electrodes has a plane configuration such that the distance from an arbitrary position on the upper surface of the lower electrode to the nearest end portion thereof is about 0.6 μm or less so that the lower electrode is planarized by an erosion phenomenon, which will be described later, without a recess formed in the upper surface thereof. This provides each of the lower electrodes with a specified configuration and prevents the polishing residue of the burying insulating film. This also prevents the peeling off of the lower electrodes from the film and variations in the thickness of the capacitor insulating films so that the data retaining property of each of memory cells is improved.

In the first ferroelectric memory device, a protective film for protecting each of the lower electrodes is preferably formed on a side surface of the lower electrode. In the arrangement, the lower electrodes are less likely to peel off.

In the first ferroelectric memory device, each of the capacitor elements preferably has a contact plug formed under the lower electrode and electrically connected to the lower electrode. The arrangement implements a capacitor element having a stacked structure in which the size of the lower electrode is smaller than or equal to that of the upper electrode.

In this case, a dummy memory cell having a dummy capacitor element including a lower electrode which does not operate electrically is preferably placed in a peripheral portion of a memory cell placement region in which the plurality of capacitor elements are placed and a contact plug connected to the lower electrode of the dummy capacitor element and nearly equal in configuration and material to the contact plug of each of the capacitor elements is preferably formed under the lower electrode of the dummy capacitor element. In the arrangement, the region to be formed with the dummy cell is uniformly reduced in film thickness due to the erosion phenomenon during the formation of the contact plugs by, e.g., CMP, similarly to the memory-cell main-body region. This ensures the planarization of the lower electrodes and the burying insulating film.

In this case, a value of a ratio of a total area of the contact plugs to an area of the memory cell placement region is preferably about 0.3 or less. In the arrangement, the depth of erosion in each of the contact plugs can be reduced to a value which does not affect the performance of the memory device.

In the first ferroelectric memory device, the lower electrode is preferably made of platinum, iridium, ruthenium, an alloy containing at least one of them, or an oxide of iridium or ruthenium. Since the ferroelectric material composing the capacitor insulating film is typically a metal oxide, a material having oxidation resistance such as platinum or iridium or ruthenium having an oxygen barrier property is suitable for the material of the lower electrodes. Besides, an oxide of iridium or ruthenium is also suitable because of its conductivity.

A method for fabricating a ferroelectric memory device according to the present invention comprises: a first step of forming a lower-electrode forming film on a semiconductor substrate and patterning the formed lower-electrode forming film to form a plurality of lower electrodes therefrom, each of the lower electrodes having an outer size such that a recess is not formed by an erosion phenomenon; a second step of depositing a burying insulating film over an entire surface of the semiconductor substrate such that the plurality of lower electrodes are covered with the burying insulating film; a third step of performing polishing with respect to the burying insulating film by chemical mechanical polishing till the lower electrodes are exposed; a fourth step of performing over-polishing with respect to the exposed plurality of lower electrodes and to the burying insulating film to planarize respective upper surfaces of the lower electrodes and of the burying insulating film; a fifth step of forming a capacitor-insulating-film forming film made of a ferroelectric material over the planarized lower electrodes and burying insulating film; a sixth step of forming an upper-electrode forming film on the capacitor-insulating-film forming film; a seventh step of patterning the capacitor-insulating-film forming film to form a plurality of capacitor insulating films therefrom, the capacitor insulating films being opposed to the respective lower electrodes; and an eighth step of patterning the upper-electrode forming film to form a plurality of upper electrodes therefrom, the upper electrodes being opposed to the respective capacitor insulating films.

In the method for fabricating a ferroelectric memory device according to the present invention, each of the plurality of lower electrodes is formed through patterning to have an outer size such that the recess is not formed by the erosion phenomenon and then over-polishing is performed with respect to the exposed lower electrodes and to the burying insulating film, so that the polishing residue of the burying insulating film is not left on the upper surface of each of the lower electrodes. In addition, each of the lower electrodes has an outer configuration such that the recess is not formed by the erosion phenomenon so that the upper surface of the lower electrode is planarized positively.

In the method for fabricating a ferroelectric memory device, the capacitor-insulating-film forming film in the fifth step is preferably formed by spin coating. In the arrangement, the capacitor-insulating-film forming film composed of the ferroelectric material can be coated uniformly on the planarized lower electrodes and burying insulating film.

Preferably, the method for fabricating a ferroelectric memory device further comprises, prior to the first step, the step of: forming, under the respective lower electrodes, a plurality of contact plugs to be connected electrically to the lower electrodes by chemical mechanical polishing, wherein a contact plug placed in a peripheral portion of a memory cell placement region in which the plurality of contact plugs are placed is for a dummy cell which does not operate electrically. In the arrangement, the region to be formed with the dummy cell is uniformly reduced in film thickness due to the erosion phenomenon during the formation of the contact plugs by CMP, similarly to the memory-cell main-body region. This ensures the planarization of the lower electrodes and the burying insulating film.

Preferably, the method for fabricating a ferroelectric memory device further comprises, between the first step and the second step, the step of forming protective films for protecting the lower electrodes on respective side surfaces of the lower electrodes. The arrangement further ensures the prevention of the peeling off of the lower electrodes from the film.

In this case, the protective films are preferably formed by depositing a protective-film forming film over an entire surface of the semiconductor substrate including the lower electrodes and etching-back the deposited protective-film forming film. The arrangement ensures the formation of the protective films on the side surfaces of the lower electrodes.

Alternatively, the protective films are formed preferably from a product generated during the patterning of the lower-electrode forming film. The arrangement obviates the necessity to add an extra step of forming the protective films and reduces the number of fabrication process steps.

Preferably, the method for fabricating a ferroelectric memory device further comprises, between the fourth step and the fifth step, the step of performing etching with respect to respective upper surfaces of the formed lower electrodes by using an etchant for the burying insulating film. In the arrangement, the upper surface of each of the lower electrodes has a depressed (dish-shaped) configuration when viewed in cross section. Even if the residue of the burying insulating film exists in the depressed portion, therefore, it can be removed reliably.

In the method for fabricating a ferroelectric memory device, the lower-electrode forming film in the first step is made of platinum, iridium, ruthenium, an alloy containing at least one of them, or an oxide of iridium or ruthenium.

BRIEF DESCRIPTION OF THE DRAWINGS

FIGS. 6A to 6C show the ferroelectric memory device according to the first embodiment, of which FIG. 6A is a cross sectional view immediately after lower electrodes are exposed, FIG. 6B is a cross sectional view after sufficient over-polishing is performed with respect to the lower electrodes, and FIG. 6C is a graph showing the depth of a recess relative to the plane size of the lower electrode when sufficient over-polishing is performed.

FIGS. 11A and 11B show a conventional ferroelectric memory device, of which FIG. 11A is a cross sectional view schematically showing lower electrodes in which recesses are formed by over-polishing and FIG. 11B is a cross sectional view schematically showing a region containing dummy cells.

DETAILED DESCRIPTION OF THE INVENTION

EMBODIMENT 1

A first embodiment of the present invention will be described with reference to the drawings.

Figure 1:
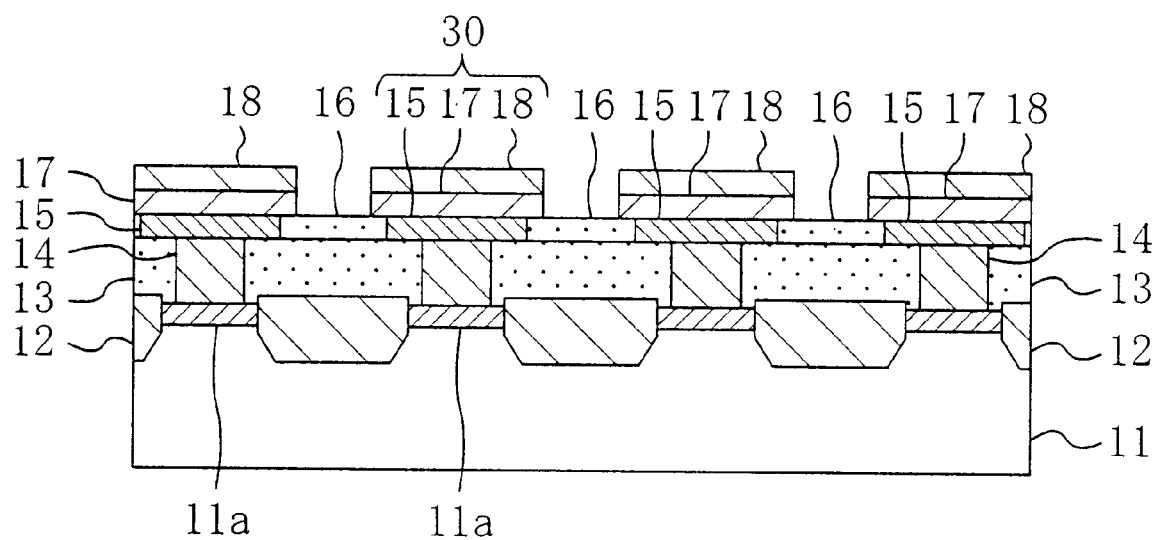
FIG. 1 is a cross sectional view schematically showing a ferroelectric memory device according to a first embodiment of the present invention.

FIG. 1 schematically shows a cross sectional structure of a memory cell portion in a ferroelectric memory device according to the first embodiment.

As shown in FIG. 1, a plurality of isolation insulating films 12 each having, e.g., an STI structure are formed in mutually spaced relationship in an upper portion of a semiconductor substrate 11 composed of, e.g., silicon (Si). In the regions between the isolation insulating films 12, heavily doped impurity diffusion layers 11a are formed to serve as the source regions or drain regions of memory cell transistors composed of MOSFETs.

The upper surface of the semiconductor substrate 11 is covered with an interlayer insulating film 13 composed of a silicon dioxide ($SiO_2$) or the like. A plurality of contact plugs 14 composed of polysilicon (Si) or tungsten (W) and electrically connected to the respective heavily doped impurity diffusion layers 11a are formed in the interlayer insulating film 13.

A plurality of lower electrodes 15 configured as a square having sides of 1.0 μm and electrically connected to the individual contact plugs 14 are formed on the interlayer insulating film 13 in such a manner that the lower electrodes 15 are buried in a burying insulating film 16 composed of, e.g., a silicon dioxide ($SiO_2$), a silicon nitride ($Si_3N_4$), or a silicon oxynitride (SiON).

Capacitor insulating films 17 composed of a ferroelectric material are formed on the respective lower electrodes 15. Upper electrodes 18 are formed on the individual capacitor insulating films 17. The lower electrode 15, the capacitor insulating film 17, and the upper electrodes 18 constitute one capacitor element 30.

For the lower electrodes 15 and the upper electrodes 18, platinum (Pt) having high oxidation resistance or iridium (Ir) or ruthenium (Ru) each having an oxygen barrier property is used preferably. It is also possible to use an iridium dioxide ($IrO_2$) or a ruthenium dioxide ($RuO_2$) each of which is an oxide having conductivity. It is also possible to use an alloy containing at least one of platinum, iridium, and ruthenium.

Although the thickness of each of the lower electrodes 15 is adjusted to about 300 nm during the deposition thereof, it is reduced to about 250 nm by a planarizing step performed with respect to the burying insulating film 16.

As the ferroelectric material used for the capacitor insulating film 17, PZT ($PbZr_xTi_{1-x}O_3$) (where 0 x 1 is satisfied)

or SBT ($SrBi_2Ta_2O_9$) is used preferably. If such a ferroelectric material is used, a variation seldom occurs in film thickness even if the film is formed by spin coating.

Figure 2:
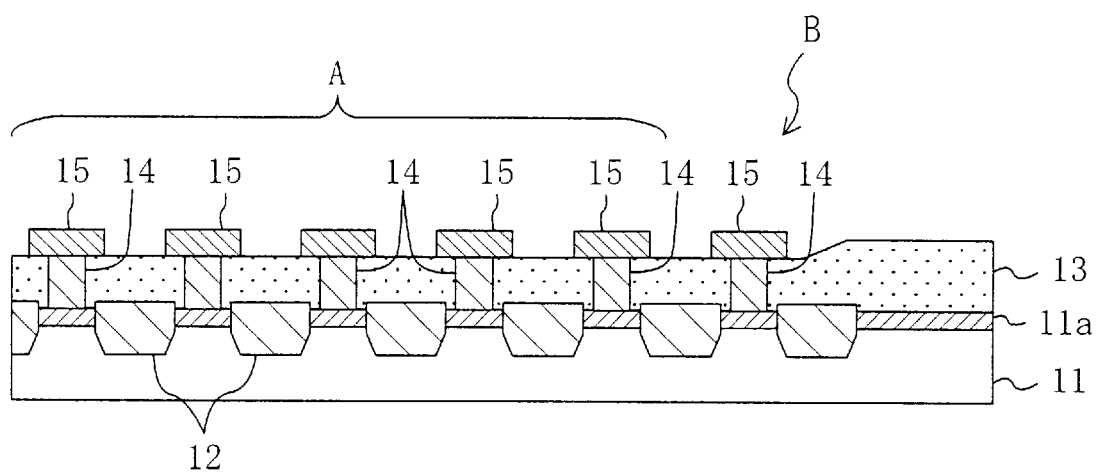
FIG. 2 is a cross sectional view schematically showing a region containing dummy cells in the ferroelectric memory device according to the first embodiment.

FIG. 2 shows a cross sectional structure of an end portion of the memory-cell main-body portion immediately after patterning for forming the lower electrodes 15 in the ferroelectric memory device according to the first embodiment. As shown in FIG. 2, the first embodiment is characterized in that the contact plug 14 is also formed for a dummy cell B provided in the peripheral portion of the memory-cell main-body region A of the semiconductor substrate 11 in which capacitor elements are arranged in rows and columns. In the arrangement, the upper surface of the interlayer insulating film 13 in the memory-cell main-body region A and that in the dummy cell B have substantially equal heights due to the erosion phenomenon occurring between the interlayer insulating film 13 and the contact plugs 14. This prevents the lower electrodes 15 from peeling off from the film.

Figure 3:
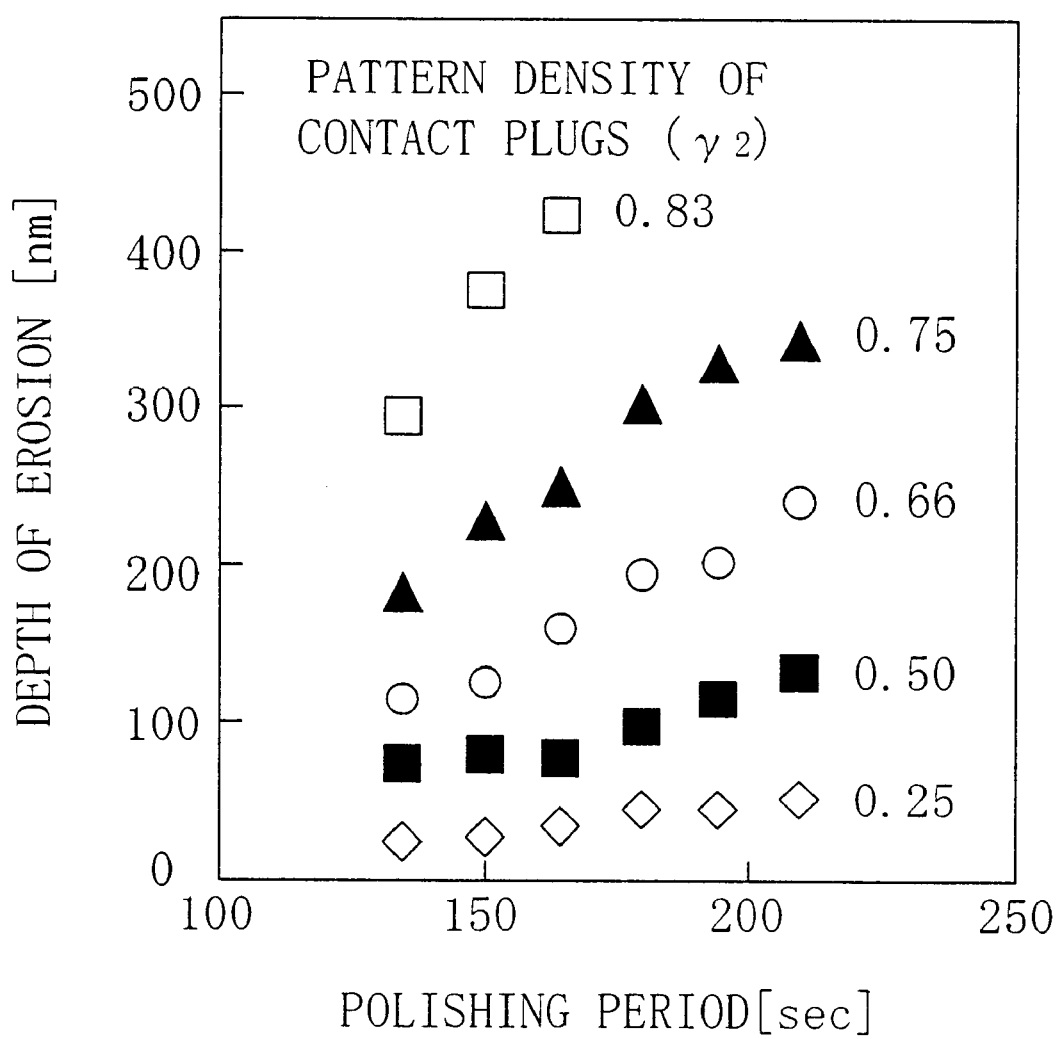
FIG. 3 is a graph showing the relationship between a polishing period and a depth of erosion by using the pattern density of contact plugs in the ferroelectric memory device according to the first embodiment.

FIG. 3 shows the relationship between a polishing period and a depth of erosion by using the pattern density $\gamma_2$ of the contact plugs as a parameter. As can be seen from FIG. 3, if the value of the pattern density $\gamma_2$ is adjusted to about 0.30 or less, the depth of erosion can be reduced to 50 nm or less which does not affect the step of planarizing the lower electrodes 15.

In the first embodiment, therefore, the pattern density $\gamma_2$ of the contact plugs 14 including the dummy cell B is adjusted to 0.25 and the depth of erosion when the pattern density $\gamma_2$ is 0.25 is 50 nm or less.

A description will be given herein below to a method for fabricating the ferroelectric memory device thus constructed.

FIGS. 4A to 4C and FIGS. 5A to 5C show the cross sectional structures of the ferroelectric memory device according to the first embodiment in the individual process steps of the fabrication method therefor.

Figure 4A:
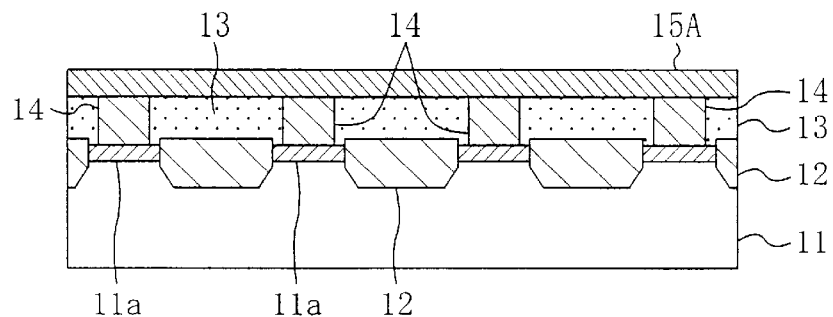
FIGS. 4A to 4C are cross sectional views illustrating the individual process steps of a method for fabricating the ferroelectric memory device according to the first embodiment.

First, as shown in FIG. 4A, the isolation insulating films 12 each having, e.g., the STI structure are formed selectively in the semiconductor substrate 11. Then, arsenic (As) ions or phosphorus (P) ions are implanted if n-type impurity layers are to be formed, whereby the heavily doped impurity diffusion layers 11a are formed to serve as the source regions or drain regions of the memory cell transistors. Then, the interlayer insulating film 13 is deposited by, e.g., CVD over the entire surface of the semiconductor substrate 11 including the isolation insulating films 12. Thereafter, contact holes for exposing the individual heavily doped impurity diffusion layers 11a are formed in the deposited interlayer insulating film 13 by lithography and etching. Subsequently, the contact plugs 14 are formed by filling polysilicon or tungsten into the formed contact holes by, e.g., CVD. At this stage, a planarizing step is performed by CMP with respect to a conductor film for forming the contact plugs and to the interlayer insulating film 13. After that, platinum is deposited by, e.g., sputtering to a film thickness of about 300 nm over the entire surface of the interlayer insulating film 13 including the contact plugs 14. The material of a lower-electrode forming film 15A may be iridium or ruthenium, instead of platinum. The material may also be an alloy containing at least one of iridium, ruthenium, and platinum or an oxide of iridium or ruthenium.

Figure 4B:
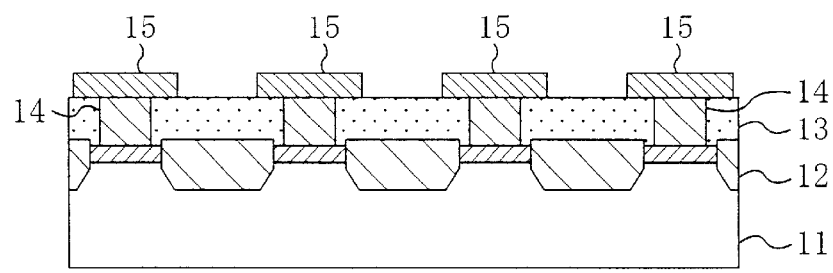

Next, as shown in FIG. 4B, the lower-electrode forming film 15A is patterned by lithography and etching to be connected to each of the contact plugs 14, whereby the lower electrodes 15 are formed from the lower-electrode forming film 15A.

Figure 4C:
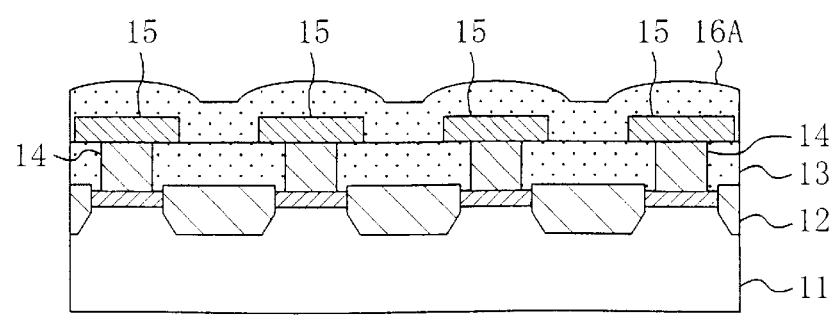

Next, as shown in FIG. 4C, a burying-insulating-film forming film 16A composed of a silicon dioxide, a silicon nitride, or the like is deposited by, e.g., CVD to a thickness of about 400 nm over the entire surface of the interlayer insulating film 13 including the lower electrodes 15.

Figure 5A:
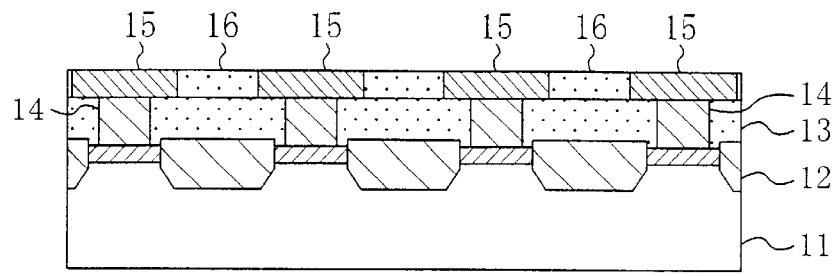
FIGS. 5A to 5C are cross sectional views illustrating the individual process steps of a method for fabricating the ferroelectric memory device according to the first embodiment.
Figure 5B:
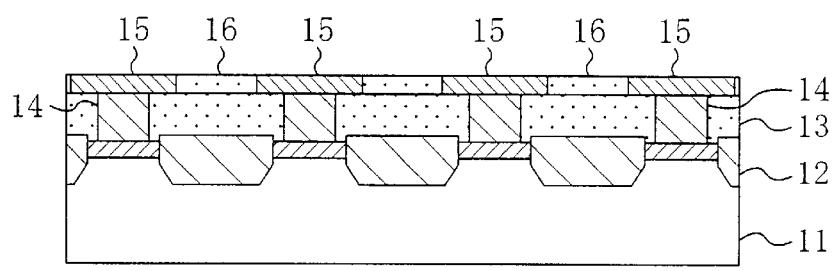
Figure 5C:
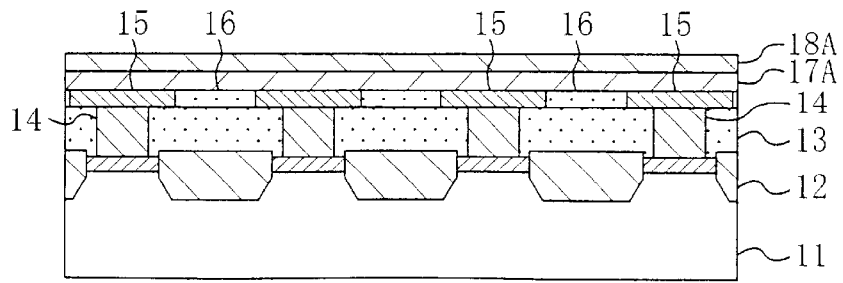

Next, as shown in FIG. 5A, a planarizing step is performed by CMP with respect to the burying-insulating-film forming film 16A till the lower electrodes 15 are exposed, thereby forming the burying insulating film 16 from the burying-insulating-film forming film 16A. Then, as shown in FIG. 5B, over-polishing is performed with respect to the exposed lower electrodes 15 and to the burying insulating film 16 by positively utilizing the erosion phenomenon till the film thickness of each of the lower electrodes 15 becomes about 250 nm.

As will be described later, if each of the lower electrodes 15 has a plane configuration in which the distance from an arbitrary position on the upper surface thereof to the nearest end portion thereof is about 0.6 $\mu$m or less, the lower electrodes 15 and the burying insulating film 16 are polished simultaneously by the erosion phenomenon. This prevents so-called polishing residue, which is the portion of the burying insulating film 16 remaining on the upper surface of the lower electrode 15, and prevents the formation of a recess in the peripheral portion of the upper surface of the lower electrode 15.

Even if the upper surface of the lower electrode 15 has a depressed portion which is hard to be followed by the polishing pad of a CMP apparatus, the burying insulating film 16 remaining in the depressed portion can surely be removed by performing a wet or dry etch-back process with respect to the entire surfaces of the lower electrodes 15 and the burying insulating film 16 after the over-polishing step.

Next, as shown in FIG. 5A, a capacitor-insulating-film forming film 17A composed of a ferroelectric material is formed over the lower electrodes 15 and the burying insulating film 16 by spin coating which allows easy adjustment of the composition ratio of the ferroelectric material and stable film formation. Subsequently, an upper-electrode forming film 18A composed of platinum or the like is deposited by sputtering or the like to a thickness of about 50 nm to 200 nm on the capacitor-insulating-film forming film 17A.

Thereafter, the upper-electrode forming film 18A and the capacitor-insulating-film forming film 17A are patterned by lithography and etching to cover each of the lower electrodes 15 so that the upper electrodes 18 are formed from the upper-electrode forming film 18A and the capacitor insulating film 17 is formed from the capacitor-insulating-film forming film 17A, whereby the ferroelectric memory device shown in FIG. 1 is obtained. Although the first embodiment has patterned the upper-electrode forming film 18A and the capacitor-insulating-film forming film 17A simultaneously, the upper-electrode forming film 18A and the capacitor-insulating-film forming film 17A may also be patterned separately.

Since the first embodiment has used platinum, iridium, ruthenium, an alloy containing at least one of them, or an oxide of iridium or ruthenium for the lower electrodes 15, even if a high-temperature heat treatment is performed with respect to the capacitor insulating films 17 composed of a ferroelectric material, which is a metal oxide, the lower electrodes 15 are stable and less reactive with oxygen contained in the metal oxide.

As a result of the foregoing fabrication steps, each of the lower electrodes 15 has its periphery filled with the burying insulating film 16, which ensures planarization. Even if the capacitor-insulating-film forming film 17A is formed by spin coating, therefore, it has a uniform thickness. This eliminates variations in the electric characteristics of the capacitor insulating film 17 due to the configuration of the formed film and provides a ferroelectric memory device with high reliability.

Referring to the drawings, a description will be given herein below to the erosion phenomenon occurring in the lower electrodes 15 composed of a material which is chemically stable and less reactive, such as platinum.

Even if the lower electrodes 15 are exposed from the burying insulating film 16 during the over-polishing by CMP, the exposed lower electrodes 15 do not normally react with a slurry so that chemical polishing does not occur. However, if a member which is different in composition from the burying insulating film 16 composed of, e.g., a silicon oxide and from the lower electrodes 15 composed of platinum exists in a region being polished, the lower electrodes 15 composed of platinum or the like, which is not the target for polishing, are graded physically under a polishing pressure due to a so-called erosion phenomenon.

Figure 6A:
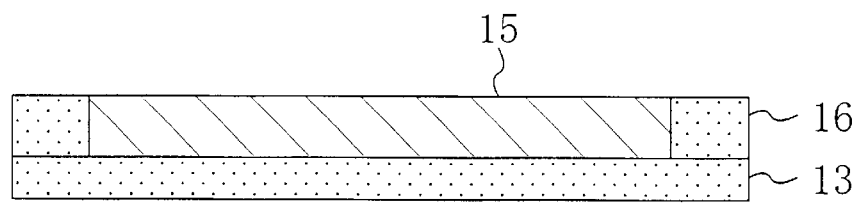
Figure 6B:
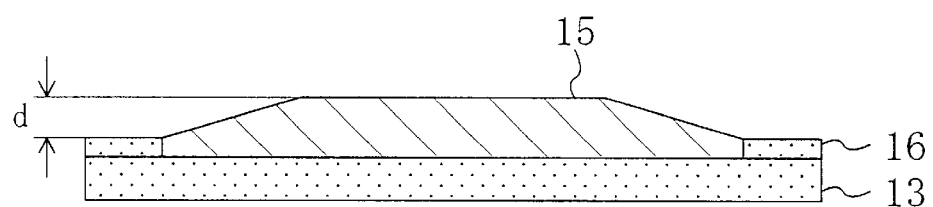

FIGS. 6A and 6B schematically show the physical grading of the lower electrodes 15, of which FIG. 6A shows a cross sectional structure immediately after the lower electrodes 15 are exposed from the burying insulating film 16 and FIG. 6B shows a cross sectional structure after sufficient over-polishing is performed with respect to the lower electrodes 15. The present structure is for experimental purposes so that the contact plugs 14 are omitted.

As a result of conducting various studies on the relationship between the size (plane size) of each of the lower electrodes 15 and the depth of a recess when over-polishing is performed with respect to the lower electrodes 15 of the capacitor elements, the present inventors have made the following findings.

If the plane size of the lower electrode 15 is relatively large, the depth d of the recess formed between the peripheral portion of the lower electrode 15 and the center portion thereof due to the erosion phenomenon is increased so that the upper surface of the lower electrode 15 that has been planarized once has a rough configuration.

However, if each of the lower electrodes 15 placed at a high density is sufficiently small in size, even the center portion of the lower electrode 15 is polished by the erosion phenomenon. The present inventors have found that this eliminates the roughness of the upper surface of the lower electrode 15 and increases the planarity thereof.

By thus relatively reducing the plane size of the lower electrode 15 and positively utilizing the erosion phenomenon, the formation of the recess can be prevented. Consequently, over-polishing can be performed with respect to the lower electrodes 15, while retaining the planarity of the upper surfaces thereof, so that the polishing residue of the burying insulating film 16 is prevented.

Figure 6C:
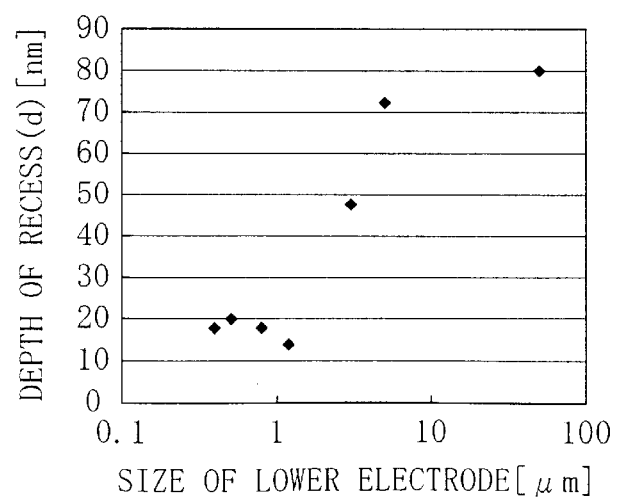

FIG. 6C shows the relationship between the plane size of each of the lower electrodes 15 and the depth of a recess when sufficient over-polishing is performed with respect thereto. Here, platinum is used for the lower electrode 15 and a silicon oxide ($SiO_2$) is used for the burying insulating film 16. The polishing is performed by using a slurry containing silica ($SiO_2$) as a main component and under such conditions that the revolving speed of a platen for polishing is about 300 rpm, the revolving speed of a carrier is about 17 rpm, and the pressure exerted on the platen of the carrier is about $3.8 \times 10^4$ Pa.

From FIG. 6C, it can be understood that the depth of the recess is as small as about 20 nm when the plane size of the lower electrode 15 is about 1.2 µm or less and even the lower electrode 15 composed of platinum is polished by the erosion phenomenon. That is, if the shortest distance from an arbitrary position on the lower electrode 15 to the end portion thereof is about 0.6 µm or less, the depth of the recess is negligible and excellent planarity is achieved. If the plane size of the lower electrode 15 is larger than 1.5 µm, on the other hand, the depth of the recess is increased to affect the operating characteristics of the capacitor element and planarization utilizing the erosion phenomenon cannot be performed.

As described above, if the lower electrode 15 composed of a material which is less reactive with the slurry is formed such that the shortest distance from an arbitrary position on the lower electrode 15 to the end portion thereof is about 0.6 µm or less, the lower electrode 15 is graded equally to the burying insulating film 16 located in the peripheral portion of the lower electrode 15 even during over-polishing so that the formation of a recess is prevented.

The depth of the recess formed in the lower electrode 15 is the same if iridium, an oxide thereof, or the like is used instead of platinum. The same result is achievable provided that a material which is hard to be polished by CMP and which can be polished only physically is used.

Figure 7A:
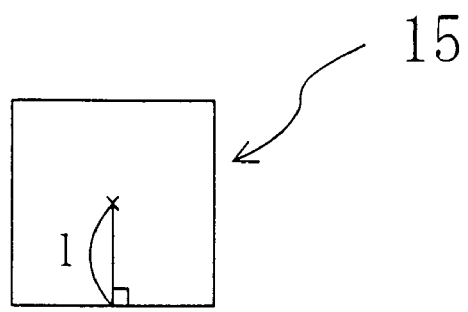
FIGS. 7A and 7B are plan views each showing the lower electrode in the ferroelectric memory device according to the first embodiment.
Figure 7B:
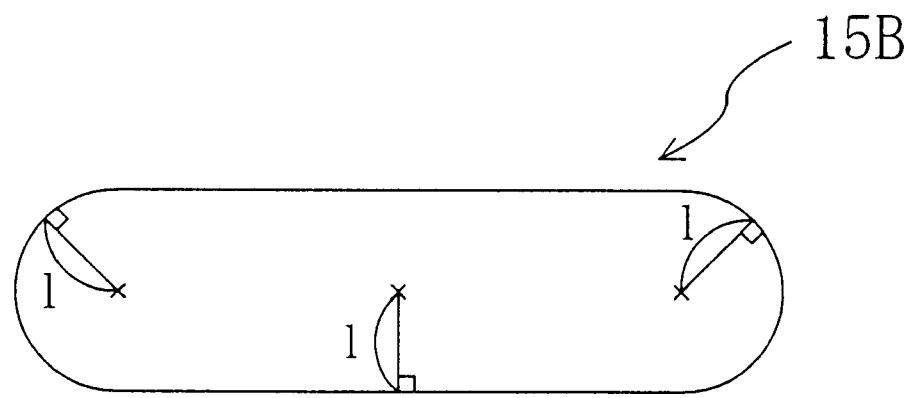

If the lower electrode 15 has a square plane configuration as shown in FIG. 7A, a perpendicular from the center position of the square to each of the sides has a shortest distance 1 so that the shortest distance 1 is achievable only at one position. If the lower electrode 15B has, e.g., an elliptical plane configuration as shown in FIG. 7B, the shortest distance 1 is achievable at a plurality of positions.

The lower electrode 15 may be composed not only of a single-layer structure but also of a multilayer structure consisting of a first conductive film containing titanium having the effect of preventing the oxidation of the contact plugs 14 and a second conductive film composed of a chemically stable material such as platinum.

EMBODIMENT 2

A second embodiment of the present invention will be described with reference to the drawings.

Figure 8:
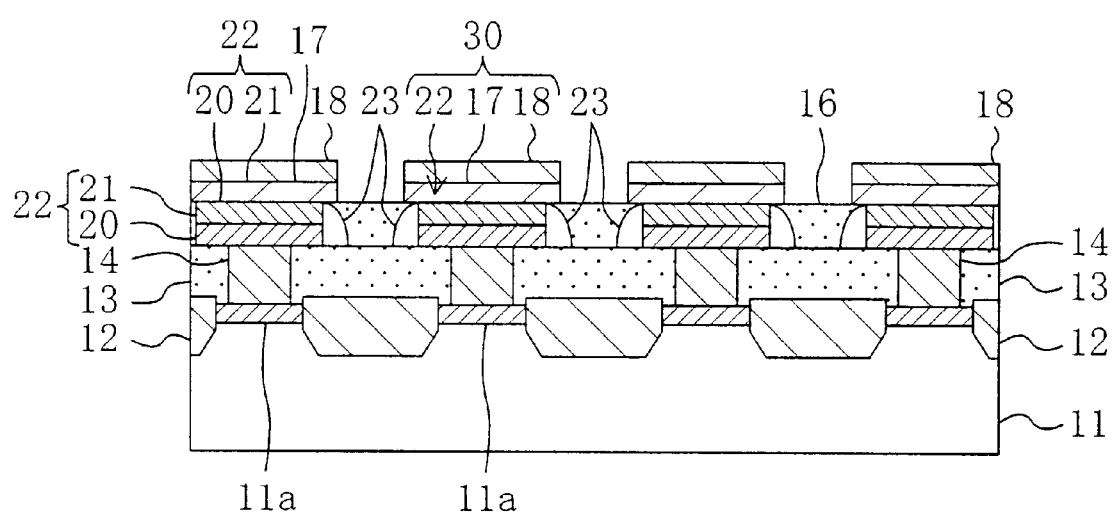
FIG. 8 is a cross sectional view schematically showing a ferroelectric memory device according to a second embodiment of the present invention.

FIG. 8 schematically shows a cross sectional structure of a memory cell portion in a ferroelectric memory device according to the second embodiment. The description of the components shown in FIG. 8 that are the same as those shown in FIG. 1 will be omitted by retaining the same reference numerals.

As shown in FIG. 8, the ferroelectric memory device according to the second embodiment is characterized in that each of lower electrodes 22 is composed of a reaction preventing film 20 and an electrode main-body film 21 which are formed successively on the contact plug 14 and that protective films 23 are formed on the side surfaces of the lower electrodes 22 to surely prevent films from peeling off from the film during the planarization of the lower electrodes 22.

In the second embodiment, each of the capacitor elements 30 is constituted by the lower electrode 22 composed of the reaction preventing film 20 and the electrode main-body film 21, the capacitor insulating film 17, and the upper electrode 18.

For the reaction preventing film 20 provided between the electrode main-body film 21 and the contact plug 14, a conductive material capable of preventing the reaction between a metal or conductive oxide composing the electrode main-body film 21 such as platinum or an iridium oxide and tungsten or polysilicon composing the contact plug 14, such as a titanium nitride (TiN), a titanium oxyniride (TiON) containing oxygen in a low proportion, or an alloy containing Ti is used preferably.

The protective films 23 for protecting the side surfaces of the lower electrodes 22 may be insulation or conductive. As the insulating material, e.g., a silicon dioxide ($SiO_2$), a silicon nitride ($SiN_x$), or a silicon oxynitride (SiON) may be used appropriately. As the conductive material, a deposit (by-product) adhering on the side surfaces of the lower electrodes 22 when patterning for forming the lower electrodes 22 is performed by dry etching using a gas mixture of, e.g., argon (Ar) and chlorine (Cl) may be used appropriately as it is. This allows the step of forming the protective films 23 and the patterning (etching) step to be omitted.

A description will be given herein below to a method for fabricating the ferroelectric memory device thus constructed.

FIGS. 9A to 9C and FIGS. 10A and 10B show the cross sectional structures of the ferroelectric memory device according to the second embodiment in the individual process steps of the fabrication method therefor.

Figure 9A:
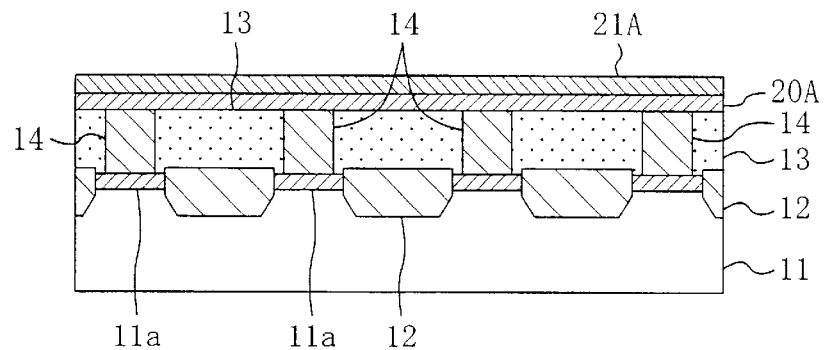
FIGS. 9A to 9C are cross sectional views illustrating the individual process steps of a method for fabricating the ferroelectric memory device according to the second embodiment.

First, as shown in FIG. 9A, isolation insulating films 12 each having an STI structure are formed selectively in the semiconductor substrate 11. Then, arsenic ions or phosphorus ions are implanted if n-type impurity layers are to be formed, whereby the heavily doped impurity diffusion layers 11a are formed to serve as the source regions or drain regions of the memory cell transistors. Then, the interlayer insulating film 13 is deposited by, e.g., CVD over the entire surface of the semiconductor substrate 11 including the isolation insulating films 12. Thereafter, contact holes for exposing the individual heavily doped impurity diffusion layers 11a are formed in the deposited interlayer insulating film 13 by lithography or etching. Subsequently, the contact plugs 14 are formed by filling polysilicon or tungsten into the formed contact holes by, e.g., CVD. At this stage, a planarizing step is performed by CMP with respect to the conductor film for forming the contact plugs and to the interlayer insulating film 13. After that, a reaction-preventing-film forming film 20A composed of a titanium nitride with a thickness of about 50 nm is deposited by, e.g., sputtering over the entire surface of the interlayer insulating film 13 including the contact plugs 14. Subsequently, platinum, for example, is deposited by sputtering to a thickness of about 250 nm over the entire surface of the interlayer insulating film 13 including the contact plugs 14. The material of an electrode-main-body forming film 21A may be iridium or ruthenium, instead of platinum. The material may also be an alloy containing at least one of iridium, ruthenium, and platinum or an oxide of iridium or ruthenium.

Figure 9B:
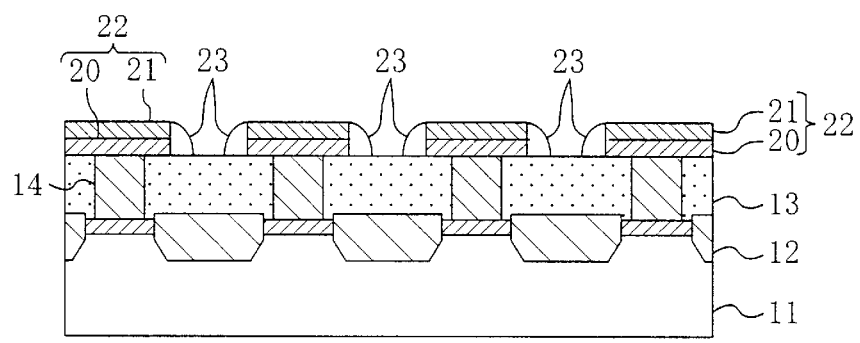

Next, as shown in FIG. 9B, the electrode-main-body forming film 21A and the reaction-preventing-film forming film 20A are patterned by lithography or dry etching to be connected to each of the contact plugs 14 so that the electrode main-body films 21 are formed from the electrode-main-body forming film 21A and the reaction preventing films 20 are formed from the reaction-preventing-film forming film 20A, whereby the lower electrodes 22 each composed of the electrode main-body film 21 and the reaction preventing film 20 are formed. Thereafter, a protective-film forming film composed of a silicon nitride with a thickness of about 100 nm is deposited by, e.g., CVD over the entire surface of the interlayer insulating film 13 including the lower electrodes 22. The deposited protective-film forming film is etched back to form the protective films 23 composed of the protective-film forming film on the side surfaces of the lower electrodes 22.

Instead of forming the sidewall-like protective films 23 from the protective-film forming film through the etch-back process, the protective films 23 may also be formed by performing dry etching using a gas mixture of argon and chlorine with respect to the electrode-main-body forming film 21A and to the reaction-preventing-film forming film 20A. This allows the formation of the protective films 23 composed of a by-product of etching and having the same composition as the lower electrodes 22 so that the adhesion between the lower electrodes 22 and the protective films 23 is improved and the number of steps is reduced desirably.

Figure 9C:
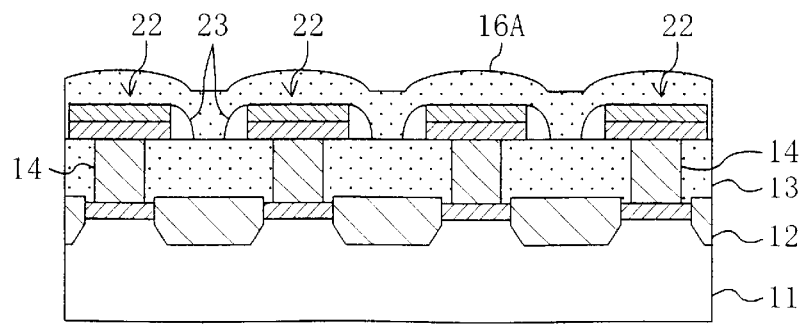

Next, as shown in FIG. 9C, the burying-insulating-film forming film 16A composed of a silicon dioxide, a silicon nitride, or the like is deposited by, e.g., CVD to a thickness of about 400 nm over the entire surface of the interlayer insulating film 13 including the lower electrodes 22 and the protective films 23.

Figure 10A:
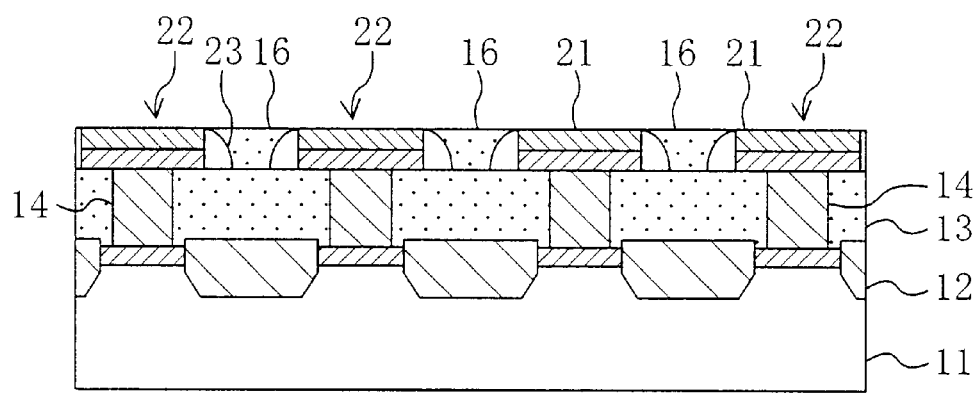
FIGS. 10A and 10B are cross sectional views illustrating the individual process steps of the method for fabricating the ferroelectric memory device according to the second embodiment.

Next, as shown in FIG. 10A, the planarizing step is performed by CMP with respect to the burying-insulating-film forming film 16A till the lower electrodes 15 are exposed, thereby forming the burying insulating film 16 from the burying-insulating-film forming film 16A. Then, over-polishing is performed with respect to the exposed lower electrodes 22 and to the burying insulating film 16 by positively utilizing the erosion phenomenon till the film thickness of each of the lower electrodes 22 becomes about 250 nm.

As described above, since the electrode main-body film 21 of each of the lower electrodes 22 has a plane configuration in which the distance from an arbitrary position on the upper surface thereof to the nearest end portion thereof is 0.6 μm or less, the electrode main-body films 21 and the burying insulating film 16 are polished simultaneously by the erosion phenomenon. This prevents so-called polishing residue, which is the portion of the burying insulating film 16 remaining on the upper surface of the lower electrode 22, and prevents the formation of a recess in the peripheral portion of the lower electrode 22.

Further, the provision of the protective films on the side surfaces of the lower electrodes 22 prevents the respective side surfaces of the reaction preventing films 20 and the electrode main-body films 21 from being exposed, which surely prevents the lower electrodes 22 from peeling off from the film due to the polishing pad. Even if the upper surface of the lower electrode 22 has a depressed portion which is hard to be followed by the polishing pad of a CMP apparatus, the burying insulating film 16 remaining in the depressed portion can surely be removed by performing a wet or dry etch-back process with respect to the entire surfaces of the lower electrodes 22 and the burying insulating film 16 after the over-polishing step.

Figure 10B:
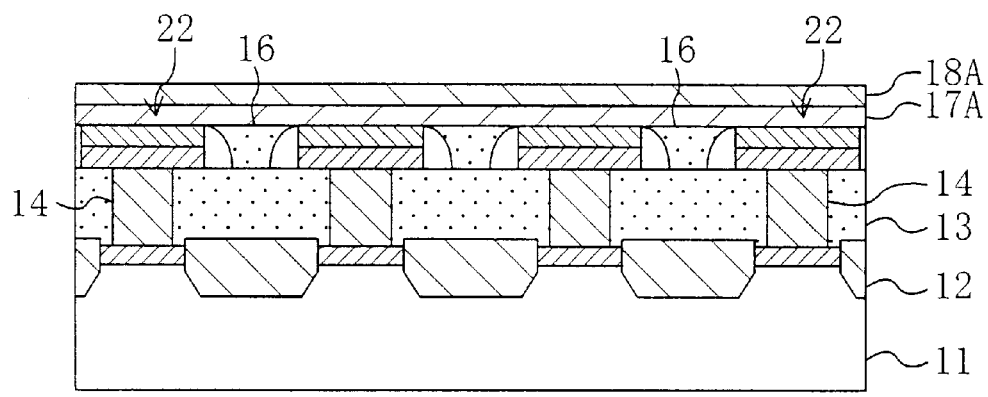
Figure 11A:
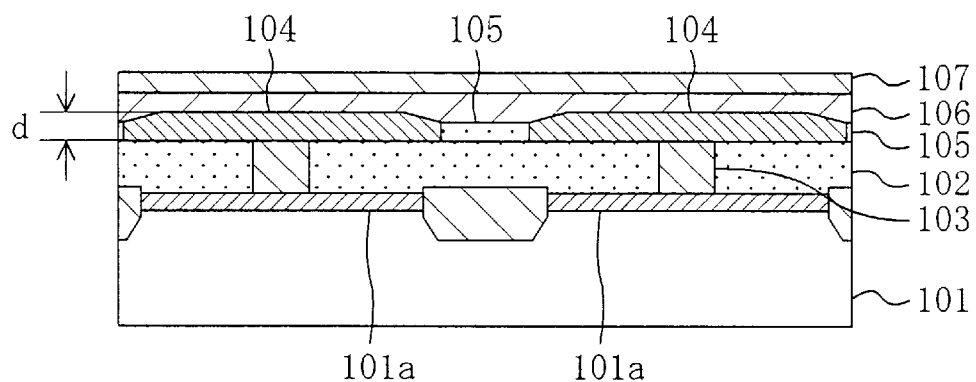
Figure 11B:
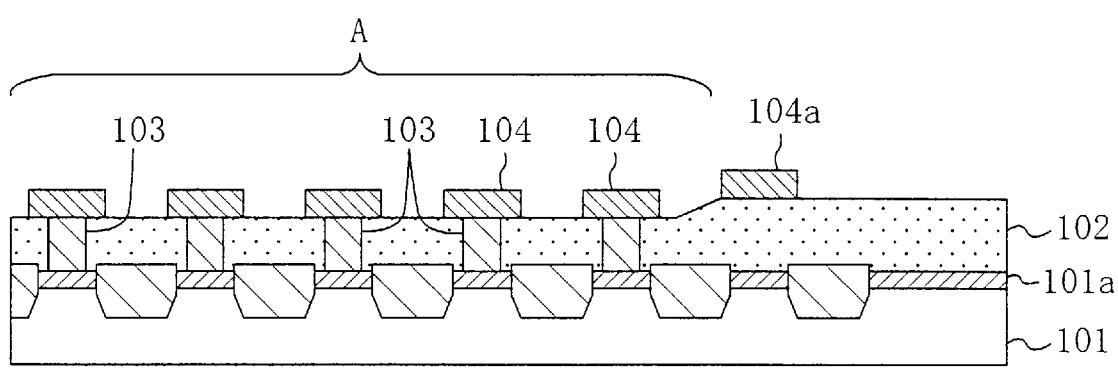

Next, as shown in FIG. 10B, the capacitor-insulating-film forming film 17A composed of a ferroelectric material is formed by spin coating over the lower electrodes 22 and the burying insulating film 16. Subsequently, the upper-electrode forming film 18A composed of platinum or the like is deposited by sputtering or the like to a thickness of about 50 nm to 200 nm on the capacitor-insulating-film forming film 17A.

Thereafter, the upper-electrode forming film 18A and the capacitor-insulating-film forming film 17A are patterned by lithography or etching to cover each of the lower electrodes 22 so that the upper electrodes 18 are formed from the upper-electrode forming film 18A and the capacitor insulating film 17 is formed from the capacitor-insulating-film forming film 17A, whereby the ferroelectric memory device shown in FIG. 8 is obtained. Although the second embodiment has patterned the upper-electrode forming film 18A and the capacitor-insulating-film forming film 17A simultaneously, the upper-electrode forming film 18A and the capacitor-insulating-film forming film 17A may also be patterned separately.

Since the second embodiment has also used platinum, iridium, ruthenium, an alloy containing at least one of them, or an oxide of iridium or ruthenium for the electrode main-body films 21 of the lower electrodes 22, even if a high-temperature heat treatment is performed with respect to the capacitor insulating films 17 composed of a ferroelectric material, which is a metal oxide, the lower electrodes 22 are less reactive with oxygen contained in the metal oxide.

Moreover, since the second embodiment has provided the reaction preventing films 20 composed of a titanium nitride or the like containing titanium between the contact plugs 14 and the electrode main-body films 21, the electrode main-body films 21 of the lower electrodes 22 are more positively stabilized.

As a result of the foregoing steps, each of the lower electrodes 22 has its periphery filled with the protective films 23 and with the burying insulating film 16, which ensures planarization. Even if the capacitor-insulating-film forming film 17A is formed by spin coating, therefore, it has a uniform thickness. This eliminates variations in the characteristics of the ferroelectric material resulting from the configuration of the formed film and provides a ferroelectric memory device with high reliability.

Since platinum or the like composing the electrode main-body films 21 of the lower electrodes 22 is a material which is normally hard to etch, if etching is performed by using an etching gas containing argon as a main component, a by-product of etching is formed on the side surfaces of the lower electrodes 22. By using the by-product as it is for the protective films 23, the protective films 23 having conductivity can be formed easily. Since the by-product is hard to remove, the peeling off of the lower electrodes 22 from the film occurring during the process of planarizing the lower electrodes 22 by CMP can be prevented positively.

The reaction preventing films 20 provided in the lower portions of the lower electrodes 22 need not necessarily be provided. The lower electrodes 22 may also be composed only of the electrode main-body films 21.

What is claimed is:

1. A method for fabricating a ferroelectric memory device, the method comprising:

a first step of forming a lower-electrode forming film on a semiconductor substrate and patterning the formed lower-electrode forming film to form a plurality of lower electrodes therefrom, each of the lower electrodes having a plane configuration in which the distance from an arbitrary position on an upper surface thereof to a nearest end portion thereof is about 0.6 $\mu$m or less;

a second step of depositing a burying insulating film over an entire surface of the semiconductor substrate such that the lower electrodes are covered with the burying insulating film;

a third step of performing polishing with respect to the burying insulating film by chemical mechanical polishing till the lower electrodes are exposed;

a fourth step of performing over-polishing with respect to the exposed plurality of lower electrodes and to the burying insulating film by positively utilizing the erosion phenomenon, to planarize respective upper surfaces of the lower electrodes and of the burying insulating film;

a fifth step of forming a capacitor-insulating-film forming film made of a ferroelectric material over the planarized lower electrodes and burying insulating film;

a sixth step of forming an upper-electrode forming film on the capacitor-insulating-film forming film;

a seventh step of patterning the capacitor-insulating-film forming film to form a plurality of capacitor insulating films therefrom, the capacitor insulating films being opposed to the respective lower electrodes; and an eight steps of patterning the upper-electrode forming film to form a plurality of upper electrodes therefrom, the upper electrodes being opposed to the respective capacitor insulating films.

2. The method of claim 1, wherein the capacitor-insulating-film forming film in the fifth step is formed by spin coating.

3. The method of claim 1, further comprising, prior to the first step, the step of:

forming, under the respective lower electrodes, a plurality of contact plugs to be connected electrically to the lower electrodes by chemical mechanical polishing, wherein a contact plug placed in a peripheral portion of a memory cell placement region in which the plurality of contact plugs are placed is for a dummy cell which does not operate electrically.

4. The method of claim 1, further comprising, between the first step and the second step, the step of:

forming protective films for protecting the lower electrodes on respective side surfaces of the lower electrodes.

5. The method of claim 4, wherein the protective films are formed by depositing a protective-film forming film over an entire surface of the semiconductor substrate including the lower electrodes and etching-back the deposited protective-film forming film.

6. The method of claim 4, wherein the protective films are formed from a product generated during the patterning of the lower-electrode forming film.

7. The method of claim 1, further comprising, between the fourth step and the fifth step, the step of:

performing etching with respect to respective upper surfaces of the formed lower electrodes by using an etchant for the burying insulating film.

8. The method of claim 1, wherein the lower-electrode forming film in the first step is made of platinum, iridium, ruthenium, an alloy containing at least one of platinum, iridium, and ruthenium, or an oxide of iridium or ruthenium.

* * * * *